United States Patent [19]

Watkiss

[11] Patent Number: 4,567,131

[45] Date of Patent: Jan. 28, 1986

[54] LITHOGRAPHIC PRINTING PLATES

[75] Inventor: Philip J. Watkiss, Leeds, England

[73] Assignee: Vickers Plc, London, England

[21] Appl. No.: 629,878

[22] Filed: Jul. 11, 1984

[30] Foreign Application Priority Data

Jul. 11, 1983 [GB] United Kingdom ............... 8318686

[51] Int. Cl.$^4$ .................. G03F 7/00; B41M 5/00; C09D 5/20

[52] U.S. Cl. .................. 430/309; 430/204; 430/205; 430/331; 430/449; 101/466; 106/2

[58] Field of Search ............... 101/465, 466; 430/204, 430/205, 309, 331, 449; 106/2

[56] References Cited

U.S. PATENT DOCUMENTS

| | | | |
|---|---|---|---|
| 2,870,704 | 1/1959 | Goldberg et al. | 101/464 |
| 3,099,209 | 7/1963 | Damschroder et al. | 101/466 |
| 3,532,599 | 10/1970 | Cooperman | 252/174.12 |
| 3,565,618 | 2/1971 | Marechal | 430/252 |
| 3,620,737 | 11/1971 | Etter et al. | 430/564 |
| 3,813,342 | 5/1974 | Cooperman | 252/174.12 |
| 3,819,374 | 6/1974 | Kemp | 430/204 |
| 3,830,649 | 8/1974 | Gracia et al. | 430/309 |
| 4,230,792 | 10/1980 | Tsubai et al. | 101/466 |
| 4,285,276 | 8/1981 | Fromson et al. | 101/465 |
| 4,299,912 | 10/1981 | Shiba et al. | 430/302 |

*Primary Examiner*—Mary F. Downey
*Attorney, Agent, or Firm*—Armstrong, Nikaido, Marmelstein & Kubovcik

[57] ABSTRACT

A lithographic printing plate having metallic silver image areas is treated with a proteolytic enzyme and an oleophilizing compound to improve ink receptivity.

10 Claims, No Drawings

LITHOGRAPHIC PRINTING PLATES

This invention relates to lithographic printing plates.

As is well known a lithographic printing plate has ink-receptive (oleophilic) image areas and water-receptive (hydrophilic) non-image areas lying in substantially the same plane.

The type of lithographic printing to which this invention relates is that in which the image areas are formed from metallic silver. Such plates may be produced by the diffusion transfer process or the physical development process.

In the diffusion transfer process, a silver halide emulsion layer is image-wise exposed to form a latent negative image which is developed in contact with a receiving layer containing development nuclei so that a positive metallic silver image is formed. Two systems are known, i.e. the two sheet system in which the silver halide layer and the receiving layer are on separate substrates and the silver halide diffuses from the negative layer to the positive layer when the two are placed in contact in the presence of a developer and the single-sheet system where both the negative silver halide layer and the positive receiving layer are coated onto the same substrate.

In the physical development process, a silver halide emulsion layer is image-wise exposed to form latent image nuclei upon which silver is deposited to form the metallic silver image.

The substrate used for the single sheet diffusion transfer process, the physical development process and the receiving layer of the two-sheet diffusion transfer process forms the non-image areas of the final printing plate. Thus the substrate may be suitably treated paper or plastics material, or a metal such as aluminium which may be grained and anodised to render its surface more lithographically suitable.

The resultant plate needs to be treated with an oleophilizing compound to increase the oleophilic properties of the silver image areas. Various treatments are known and are detailed in pages 105 and 106 of "Photographic Silver Halide Diffusion Processes" by Andre Rott and Edith Weyde (The Focal Press).

Even after such treatment, however, it has been found that if gelatin has been used as the binder in the silver-halide emulsion, the surface of the image areas is reluctant to take ink.

It is an object of the present invention to improve the ink receptivity of lithographic printing plates having image areas of metallic silver derived from silver halide emulsions.

In accordance with the present invention, this is achieved by applying to the plate a proteolytic enzyme and subsequently or simultaneously applying an oleophilizing compound.

Accordingly one aspect of the present invention provides a finishing composition for treating a lithographic printing plate having image areas of metallic silver, the composition comprising (i) a proteolytic enzyme and (ii) a compound capable of rendering the silver image areas oleophilic.

The finishing composition will generally be an essentially aqueous solution containing effective amounts of the enzyme and the oleophilizing compound. Typically, the enzyme constitutes from 0.1% to 10.0% by weight of the total composition and the oleophilizing compound constitutes from 0.05% to 5% by weight of the total composition.

The enzyme is chosen from that class of enzymes which specifically catalyse the breakdown of proteins. For example, trypsin, pepsin, ficin, papain or bacterial proteinases such as "Gelatase C" (ABM Chemicals Ltd.) may be used although trypsin and papain are preferred. Enzyme activity is very pH dependent and enzymes in general will not withstand extremes or pH or temperature or the presence of strong oxidising or reducing agents. Hence the composition should be formulated and used in a manner such that these are avoided.

The oleophilizing compound may be any of those disclosed on pages 105 and 106 of "Photographic Silver Halide Diffusion Processes" by Andre Rott and Edith Weyde (hereby incorporated by reference) but mercapto compounds and cationic surfactants such as quaternary ammonium compounds are preferred oleophilizing compounds.

In accordance with a preferred embodiment, a desensitizing treatment for the non-image areas is carried out either simultaneously or subsequently. In the former case, the finishing composition additionally comprises an effective amount of a lithographic desensitizing compound. Typically, the desensitizing compound constitutes from about 1.0 to 10.0% by weight of the total composition.

Carbohydrates such as gum arabic and dextrin may be used as desensitizing compounds without affecting the enzyme.

The run-length of the treated plates may be increased by applying a lacquer (based, for example on phenol or cresol novolak resins) to the image areas. It is believed that treatment of the plate with the finishing composition in accordance with the invention provides better adhesion of the lacquer to the image areas and thus a longer run-length.

The following examples illustrate the invention.

EXAMPLE 1

Single Sheet DTR System

Electrochemically grained and anodised aluminium substrates were coated, in order, with a nucleation layer comprising silver sol. in gelatin binder and a silver chlorobromide-gelatin emulsion. These coated substrates were then exposed and developed in a diffusion transfer type developer to form lithographic printing plates. The composition of the developer was as follows:

Sodium Sulphite: 50 g.
hydroquinone: 12 g.
Phenidone: 3 g.
sodium hydroxide: 10 g.
sodium thiosulphate: 5 g.
Water: to 1 liter Phenidone is a proprietory form of 1-phenyl-3-pyrazolidone.

The plates were then washed with water to remove the chemically developed silver and the silver image areas remaining on the plates were subjected to the treatments detailed below. In all cases the plates were buff-dried after the treatment and then put on a FAG Offset Press 104, which is a proofing press, and the ink-receptivity determined from the number of impressions required before good quality prints were obtained. In general, the ink-receptivity was considered to be very good if less than 5 impressions were required, good if from 5 to 10 impressions were required, moderate if from 10 to 15 impressions were required and poor if from 15 to 20 impressions were required. If greater than 20 impressions did not yield a satisfactory print, the image was considered to have no oleophilicity for pratical purposes.

In each case, the treatment solution was applied to a plate at an amount of 50 mls/m² for 20 seconds at room temperature.

Treatment 1

The following solution was used:
37 mls water
1.25 gms Triton X-100 (non-ionic surfactant)
7.3 mls Gum Arabic
0.25 mls ortho phosphoric acid
0.6 mls Proxel XL-2 (bactericide)
5 mls of a 2% solution of 2-mercaptobenzthiazole in polyethylene glycol 200 (PEG 200).
(Triton X-100 is a proprietory form of octyl phenoxy polyethoxy ethanol).

Treatment 2

The following buffered trypsin solution was used
4.77 gms Borax
200 mls 0.1M hydrochloric acid
10 gms Trypsin (bovine pancreatic)
150 mls Gum Arabic
0.5 gm Caclium nitrate
deionised water to 1 liter pH 8.0

Treatment 3

This treatment was identical to Treatment 2 except that the excess solution was wiped-off and the plate was then treated as in Treatment 1.

Treatment 4

The solution of Treatment 2 was used to which had been added 100 mls of a 2% solution of 2-mercapto benzthiazole in polyethylene glycol 200.

Treatment 5

The following solution was used:
500 mls water
10 gms sodium dihydrogen phosphate
150 mls Gum Arabic
100 mls 2% solution of phenylmercaptotetrazole in polyethylene glycol 200
1.0N sodium hydroxide to give pH 6.0

Treatment 6

The solution of Treatment 2 was used to which had been added 100 mls of a 2% solution of phenylmercaptotetrazole in PEG 200.

Treatment 7

The following buffered solution of Ficin was used:
500 mls water
4.77 gms Borax
200 mls 0.1M hydrochloric acid
150 mls Gum Arabic
100 mls 2% phenylmercaptotetrazole in PEG 200
10 gms Ficin
Water to 1 liter pH 8.0

Treatment 8

The following solution of Pepsin was used:
500 mls water
10 gms Pepsin
150 mls Gum Arabic
100 mls 2% phenylmercaptotetrazole in PEG 200
Orthophosphoric acid to pH 2.0
Water to 1 liter

Treatment 9

The following solution of papain was used:
500 mls water
10 gms sodium dihydrogen phosphate
1.0N sodium hydroxide to pH 6.0
10 gms papain
100 mls 2% phenylmercaptotetrazole in PEG 200
Water to 1 liter

Treatment 10

A solution was used which was similar to the solution of Treatment 9 but containing 1 gm/liter papain

Treatment 11

The solution of Treatment 2 was used to which had been added 10 gms/liter cetyltrimethylammonium bromide

Treatment 12

The solution of Treatment 2 was used to which had been added 10 gms/liter cetylpyridinium chloride.

Treatment 13

The solution of Treatment 2 was used to which had been added 1 gm/liter trypsin.

Treatment 14

The solution of Treatment 2 was used to which had been added 0.1 gm/liter trypsin.

Treatment 15

The following solution of a bacterial enzyme was used:
800 mls water
10 gms potassium hydrogen phthalate
1.0N sodium hydroxide to pH 6.0
10 mls Proteinase 200L
10 gms cetylpyridinium chloride
water to 1 liter Proteinase 200L is bacterial neutral proteinase obtained from ABM Chemicals.

The following results were obtained.

| TREATMENT | ENZYME | OLEOPHILIZING COMPOUND | INK RECEPTIVITY |
| --- | --- | --- | --- |
| 1 | NONE | 2-mercaptobenzthiazole | NONE |
| 2 | 1% trypsin | NONE | NONE |
| 3 | 1% trypsin | 2-mercaptobenzthiazole | GOOD |
| 4 | 1% trypsin | 2-mercaptobenzthiazole | GOOD |
| 5 | NONE | Phenylmercaptotetrazole | NONE |
| 6 | 1% trypsin | Phenylmercaptotetrazole | GOOD |
| 7 | 1% ficin | Phenylmercaptotetrazole | VERY GOOD |
| 8 | 1% pepsin | Phenylmercaptotetrazole | MODERATE |

| TREATMENT | ENZYME | OLEOPHILIZING COMPOUND | INK RECEPTIVITY |
|---|---|---|---|
| 9 | 1% papain | Phenylmercaptotetrazole | VERY GOOD |
| 10 | 0.1% papain | Phenylmercaptotetrazole | MODERATE |
| 11 | 1% trypsin | Cetyltrimethylammonium bromide | VERY GOOD |
| 12 | 1% trypsin | Cetylpyridinium chloride | VERY GOOD |
| 13 | 0.1% trypsin | Cetylpyridinium chloride | MODERATE |
| 14 | 0.01% trypsin | Cetylpyridinium chloride | POOR |
| 15 | 1% Proteinase 200L | Cetylpyridinium chloride | GOOD |

EXAMPLE 2

Two sheet DTR System

This system comprised an electrochemically grained aluminium substrate coated with a silver sol. of average particle diameter 50 Å and a paper base coated with a silver chlorobromide-gelatin emulsion.

The paper was exposed and the assembly processed in the conventional manner in an ADT 026 processing machine (Develop GmbH) using the developer of Example 1. After the sheets were peeled apart the silver image remaining on the aluminium reactor sheet was treated with fixing solution prior to testing the resultant lithographic printing plate on the proof press.

Mottle blinding is often associated with plates produced in this way. The extent of it depends on several factors including, in particular, the amount of gelatin or other binder, in the donor sheet and the degree to which it has been hardened.

A plate showing this effect when treated in the conventional manner was treated as in treatment 6 of Example 1. This treatment removed the blinding and resulted in a plate with excellent ink receptivity over the whole of the silver image.

EXAMPLE 3

An electrochemically grained and anodised aluminium sheet was coated with a silver iodobromide-gelatin emulsion to about 0.1 gm Ag m$^{-2}$. This was exposed and developed for 20 seconds in a physical developer containing 10 gm/liter silver nitrate and an $Fe^{2+}/Fe^{3+}$ redox couple to produce a lithographic printing plate having a metallic silver image of about 5 gm Ag m$^{-2}$. This plate when treated as in treatment 6 showed much better ink receptivity than one treated with an oleophilizing solution not containing the enzyme.

EXAMPLE 4

The following finishing composition was prepared:
37 mls Trypsin/borate buffer solution
1.25 mls Triton X-100
7.3 mls Gum Arabic
0.6 mls Proxel XL2 (bactericide)
2.5 mls 2% solution of 2-mercaptobenzo thiazole in polyethylene glycol The pH of the composition was 7.8. The buffer solution had the following ingredients:
50 mls 0.025N Borax.
20 mls 0.1N Hydrochloric acid.
0.5 g Trypsin
20 mg Calcium nitrate.
30 mls water.

A similar finishing composition was prepared except that the trypsin was omitted from the buffer solution.

A single-sheet diffusion transfer plate consisting of an electrolytically grained and anodised aluminium substrate coated with a positive receiving layer consisting of silver particles in a gelatin binder and a silver chlorobromide/gelatin emulsion, was exposed and developed in the manner of Example 1.

The resultant lithographic printing plate was washed with water, and the two finishing compositions were applied respectively to separate areas thereof. The plate was rubbed with normal lithographic inking-in ink. The area treated with the enzyme-containing finishing composition accepted the ink immediately whereas considerable rubbing was necessary before the other area reluctantly accepted the ink.

EXAMPLE 5

Example 4 was repeated except that papain was the enzyme used and the composition had a pH of 6.0.
Similar results were obtained.

EXAMPLE 6

Examples 4 and 5 were repeated except that phenylmercaptotetrazole was used as the oleophilizing compound. Similar results were obtained.

EXAMPLE 7

The following finishing composition was prepared:
75 mls Trypsin/borate buffer.
5 g Triton X405 (non-ionic surfactant).
1 g Cetyltrimethylammonium bromide.
15 mls Gum Arabic.

The pH was adjusted to 8.0 with 1N sodium hydroxide.

An equivalent composition without the trypsin was also prepared and the two finishing compositions were applied to separate areas of a developed lithographic printing plate produced as in Example 4. Results similar to those of Example 4 were obtained.

EXAMPLE 8

Examples 4 to 7 were repeated using a lithographic printing plate produced by the two-sheet diffusion transfer system. Similar results were again obtained.

The two-sheet system consisted of an electrolytically grained aluminium substrated coated with a silver particle/gelatin positive receiving layer and a paper substrate coated with a silver halide/gelatin emulsion.

EXAMPLE 9

The finishing compositions of Examples 4 to 7 were applied to lithographic printing plates produced by a physical development process and similar results were obtained.

The plates used consisted of an electrolytically grained aluminium substrate coated with a silver halide/gelatin emulsion. After exposure, the plates were placed in a physical developer containing a silver salt and a reducing agent.

I claim:

1. A finishing composition for treating a lithographic printing plate having image areas of metallic silver, the composition comprising (i) a proteolytic enzyme and (ii) a compound capable of rendering the image areas oleophilic.

2. A composition as claimed in claim 1 wherein the enzyme is trypsin, pepsin, ficin, papain or a bactericidal proteinase.

3. A composition as claimed in claim 1 wherein said compound is a mercapto compound.

4. A composition as claimed in claim 3 wherein said compound is 2-mercaptobenzthiazole or phenylmercaptotetrazole.

5. A composition as claimed in claim 1 wherein said compound is a cationic surfactant.

6. A composition as claimed in claim 5 wherein said compound is cetyltrimethyl ammonium bromide or cetylpyridinium chloride.

7. A composition as claimed in claim 1 and additionally including a lithographic desensitizing compound.

8. A composition as claimed in claim 7, wherein said lithographic desensitizing compound is gum arabic or dextrin.

9. A method of treating a lithographic printing plate having image areas of metallic silver, the method comprising applying a proteolytic enzyme and subsequently or simultaneously applying a compound capable of rendering the image areas oleophilic.

10. A method according to claim 9, comprising simultaneously or subsequently applying a lithographic desensitizing compound.

* * * * *